United States Patent
Iwasaki

(10) Patent No.: US 9,481,217 B2
(45) Date of Patent: Nov. 1, 2016

(54) METHOD FOR GENERATING TIRE MODEL

(71) Applicant: Sumitomo Rubber Industries, Ltd., Kobe-shi, Hyogo (JP)

(72) Inventor: Naoaki Iwasaki, Kobe (JP)

(73) Assignee: SUMITOMO RUBBER INDUSTRIES, LTD., Kobe-Shi (JP)

(*) Notice: Subject to any disclaimer, the term of this patent is extended or adjusted under 35 U.S.C. 154(b) by 792 days.

(21) Appl. No.: 13/756,608

(22) Filed: Feb. 1, 2013

(65) Prior Publication Data

US 2013/0304428 A1    Nov. 14, 2013

(30) Foreign Application Priority Data

May 11, 2012   (JP) ................... 2012-109894

(51) Int. Cl.
*G06F 17/50* (2006.01)
*B60C 99/00* (2006.01)

(52) U.S. Cl.
CPC ......... *B60C 99/006* (2013.04); *G06F 17/5018* (2013.01); *G06F 17/5095* (2013.01)

(58) Field of Classification Search
None
See application file for complete search history.

(56) References Cited

U.S. PATENT DOCUMENTS

| | | | |
|---|---|---|---|
| 6,430,993 B1* | 8/2002 | Seta | 73/146 |
| 6,564,625 B1* | 5/2003 | Ishiyama | 73/146 |
| 6,691,566 B2* | 2/2004 | Iwasaki et al. | 73/146 |
| 6,868,716 B2* | 3/2005 | Okano et al. | 73/146 |
| 7,464,586 B2* | 12/2008 | Kabe et al. | 73/146 |
| 8,221,568 B2* | 7/2012 | Hanada | B60C 13/00 156/110.1 |
| 9,156,313 B2* | 10/2015 | Thompson | B60C 99/006 |
| 2008/0105347 A1* | 5/2008 | Matsunaga | B60C 11/00 152/209.14 |

FOREIGN PATENT DOCUMENTS

| | | |
|---|---|---|
| EP | 1 186 447 A2 | 3/2002 |
| JP | 2007-131206 A | 5/2007 |
| JP | 2007-283859 A | 11/2007 |
| JP | 2007283859 A * | 11/2007 |
| JP | 2010-191612 A | 9/2010 |
| JP | 2012-56546 A | 3/2012 |

OTHER PUBLICATIONS

Wikipedia "Elastic Modulus" WayBack Machine Internet Archive (Nov. 19, 2011) available at <http://web.archive.org/web/20111119065935/http://en.wikipedia.org/wiki/Elastic_modulus>.*
Extended European Search Report, dated Aug. 22, 2013, for European Application No. 13158887.3.

* cited by examiner

*Primary Examiner* — Kamini S Shah
*Assistant Examiner* — Jay B Hann
(74) *Attorney, Agent, or Firm* — Birch, Stewart, Kolasch & Birch, LLP

(57) ABSTRACT

In a computerized method for generating a finite element model of a pneumatic tire provided in the tread portion with a zero-degree band, a 2D tire model is firstly generated based on the finished tire shape in a tire vulcanization mold, where the 2D tire model includes a 2D model of a band ply. Secondary, a residual stress is computed and defined on each element of the band ply model. Then, a deformation calculation is made on the 2D tire model to obtain the deformed 2D tire model. Finally, a 3D tire model is generated by duplicating the 2D tire model around the tire rotational axis.

2 Claims, 11 Drawing Sheets

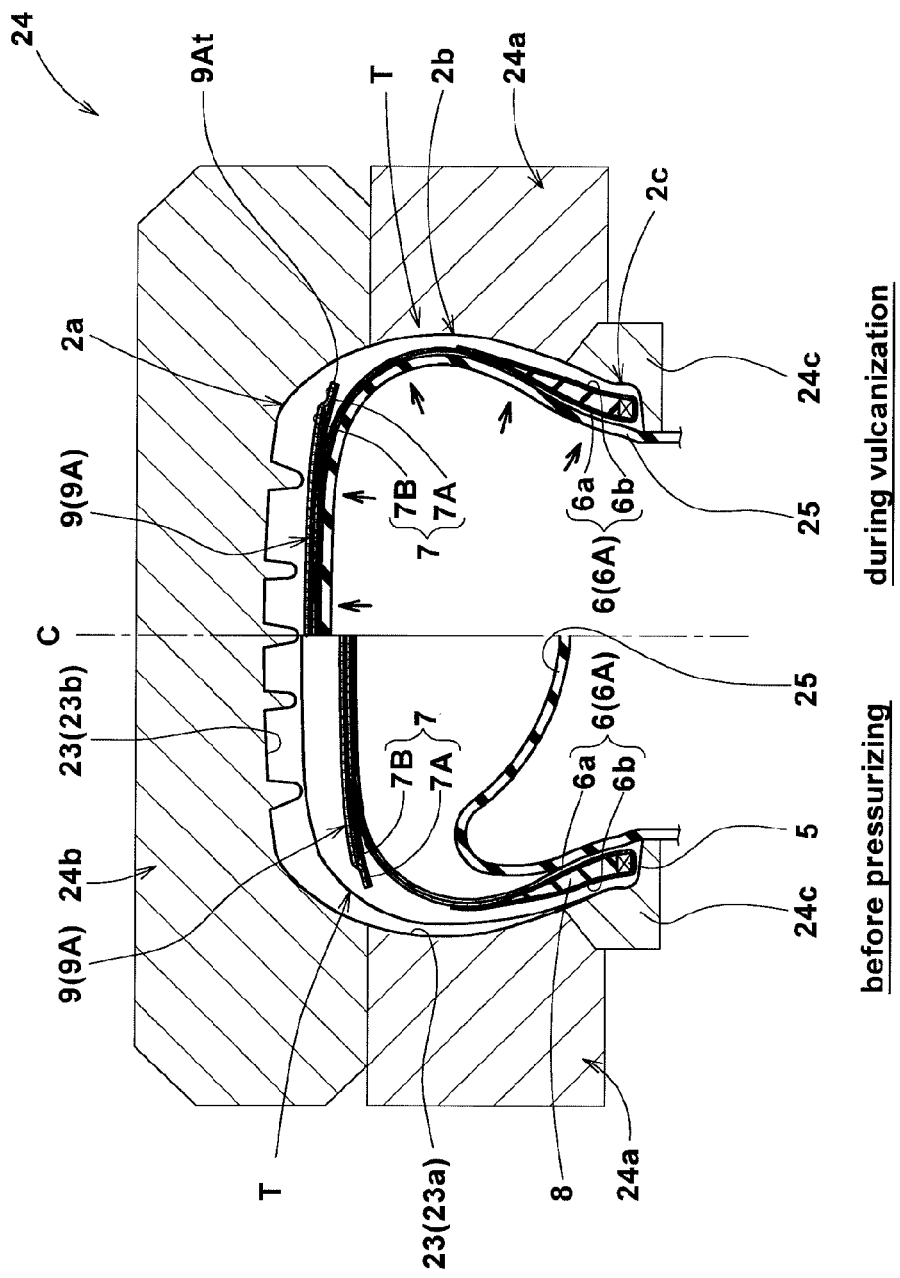

METHOD FOR GENERATING TIRE MODEL

BACKGROUND OF THE INVENTION

The present invention relates to a computerized method for generating a finite element model of a pneumatic tire capable of improving simulation accuracy.

In general, a pneumatic tire is manufactured by first building a raw tire by assembling rubber members, cord reinforced layers and the like, and then vulcanizing the raw tire in a mold by pressurizing the inside of the raw tire. Therefore, the cords embedded in the vulcanized tire usually have residual stress. Due to the residual stress, accordingly, there is a tendency such that the shape of the demolded tire becomes smaller than the finished tire shape in the vulcanization mold.

In Japanese Patent Application Publication No. 2010-191612, a computerized method for simulating a rolling tire is disclosed. In this method, a finite element model of the tire is generated, based on the finished shape of a tire in a vulcanization mold, namely, the shape of the mold cavity.

As a result, there is a tendency that the shape of the tire model generated based on the finished tire shape in the vulcanization mold differs from (usually, becomes smaller than) the shape of the tire during use.

Thus, it is difficult to fully improve the accuracy of simulation using such a tire model.

The present inventor, therefore, made researches and found that simulation errors are large when the tire is provided in the tread portion with so called zero-degree band (namely, a cord reinforced rubber layer wherein the cord angle is about 5 degrees or less with respect to the tire circumferential direction). In such a tire, the residual stress becomes relatively large in the band when compared with other cord reinforced layers, and the band has much effect on the tire shape.

SUMMARY OF THE INVENTION

It is therefore, an object of the present invention to provide a method for generating a finite element model of a pneumatic tire provided in the tread portion with a band, in which, a residual stress is defined on a band model of a tire model to approximate the shape of the tire model to the shape of the tire during use, and thereby it becomes possible to improve the accuracy of simulation using the tire model.

A computerized method for generating a finite element model of a pneumatic tire according to the present invention is for the tire manufactured through a step of building a raw tire provided in a tread portion with a band ply composed of a band cord having a cord angle of not more than 5 degrees with respect to the tire circumferential direction, and a step of vulcanizing the raw tire in a vulcanization mold, and the method comprises a step in which, based on a cross-sectional shape of the tire in the vulcanization mold, a tire model which is a finite element model of the tire is generated, wherein the tire model includes a band ply model of the band ply made up of elements, and a residual stress defining step in which a residual stress Si caused by the vulcanizing step is computed and defined on each of the elements of the band ply model of the tire model, and a deformation calculation is made on the tire model to obtain the deformed tire model.

The residual stress Si is computed by the following manner (I), (II) or (III).

(I) For each of the elements of the band ply model, the residual stress Si is computed by the following expression $$Si = E \times \{(Ra - ra)/ra\} \times \alpha$$

wherein
E: the Young's modulus of the band cord,
Ra: the outside diameter of the element,
ra: the outside diameter of the element before vulcanization
$\alpha$: a coefficient.

(II) For all of the elements of the band ply model, the residual stress Si is computed collectively by the following expression $$Si = E \times \{(Ra - ra)/ra\} \times \alpha$$

wherein
E: the Young's modulus of the band cord,
Ra: the mean value of the outside diameters of the elements belonging to the group
ra: the mean value of the outside diameters of the elements belonging to the group before vulcanization
$\alpha$: a coefficient.

(III) The elements of the band ply model are grouped into a plurality of groups each consisting of axially abutting elements, and for each of the groups, the residual stress Si is computed collectively by the following expression $$Si = E \times \{(Ra - ra)/ra\} \times \alpha$$

wherein
E: the Young's modulus of the band cord,
Ra: the mean value of the outside diameters of the elements belonging to the group
ra: the mean value of the outside diameters of the elements belonging to the group before vulcanization
$\alpha$: a coefficient.

In the case of (III), it is preferable that the groups include: a central group consisting of the elements existing in a central region of the tread portion; and two lateral groups consisting of the elements existing in shoulder regions of the tread portion.

The method may further comprises, before the residual stress defining step, a step in which a deformation calculation is made on the tire model on which a condition of a tire pressure is defined.

The above-mentioned tire model is two-dimensional, and the method may further comprises a step in which a three-dimensional tire model is generated by circumferentially duplicating the two-dimensional tire model around the tire rotational axis at intervals of a small angle.

Therefore, due to the residual stress Si defined on each element of the band ply model, the tire model is deformed similarly to the actual tire. In other words, it is possible to generate the tire model having a shape approximate to that of the tire during use. As a result, simulation accuracy can be improved.

In the case of (I), it is possible to generate the tire model having a shape most approximate to that of the tire during use. In the case of (II) or (III), the computational time can be reduced in comparison with (I).

BRIEF DESCRIPTION OF THE DRAWINGS

FIG. 4 is a cross sectional view for explaining a step of vulcanizing the raw tire.

FIG. 9($b$) is a cross sectional view of the band ply model of which elements are grouped into a single group.

DESCRIPTION OF THE PREFERRED EMBODIMENTS

Embodiments of the present invention will now be described in detail in conjunction with accompanying drawings.

Figure 1:
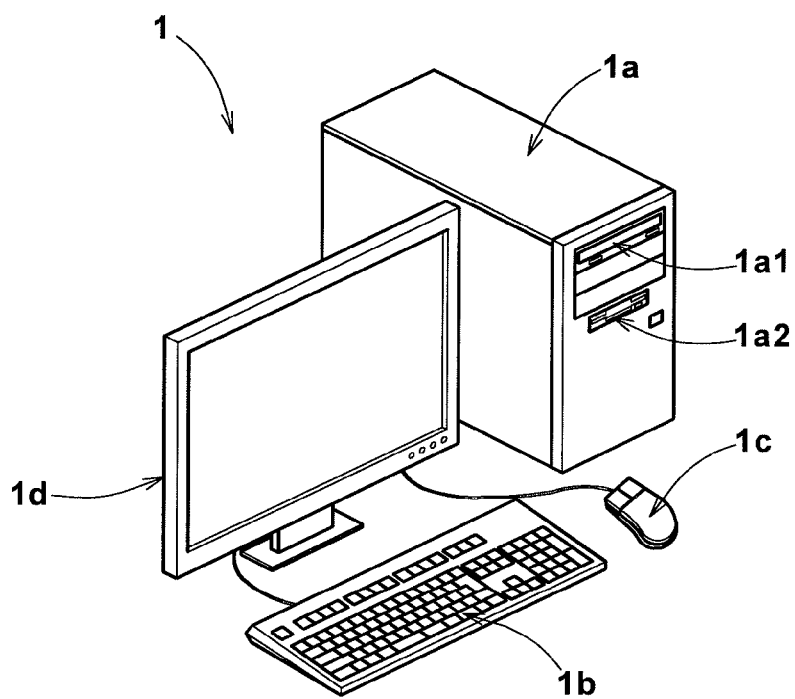
FIG. 1 shows an example of the computer system implementing a method according to the present invention.

According to the present invention, a tire model 3 which is a finite element model of a pneumatic tire 2 is generated, wherein the tire model 3 is made up of a finite number of elements so that numerical analyses are possible by the use of a computer for example as shown in FIG. 1.
The expression "numerical analyses are possible" means that it is possible to deal with the tire model 3 in a numerical analysis method such as finite element method, finite volume method, finite difference method and boundary element method. In this embodiment, a finite element method is employed.

The computer 1 comprises a main body 1$a$, a keyboard 1$b$, a mouse 1$c$ and a display 1$d$. The main body 1$a$ comprises an arithmetic processing unit (CPU), ROM, work memory, storage devices such as magnetic disk, disk drives 1$a$1 and 1$a$2 and the like. In the storage device, programs/software for carrying out a generating method in this embodiment are stored.

Figure 2:
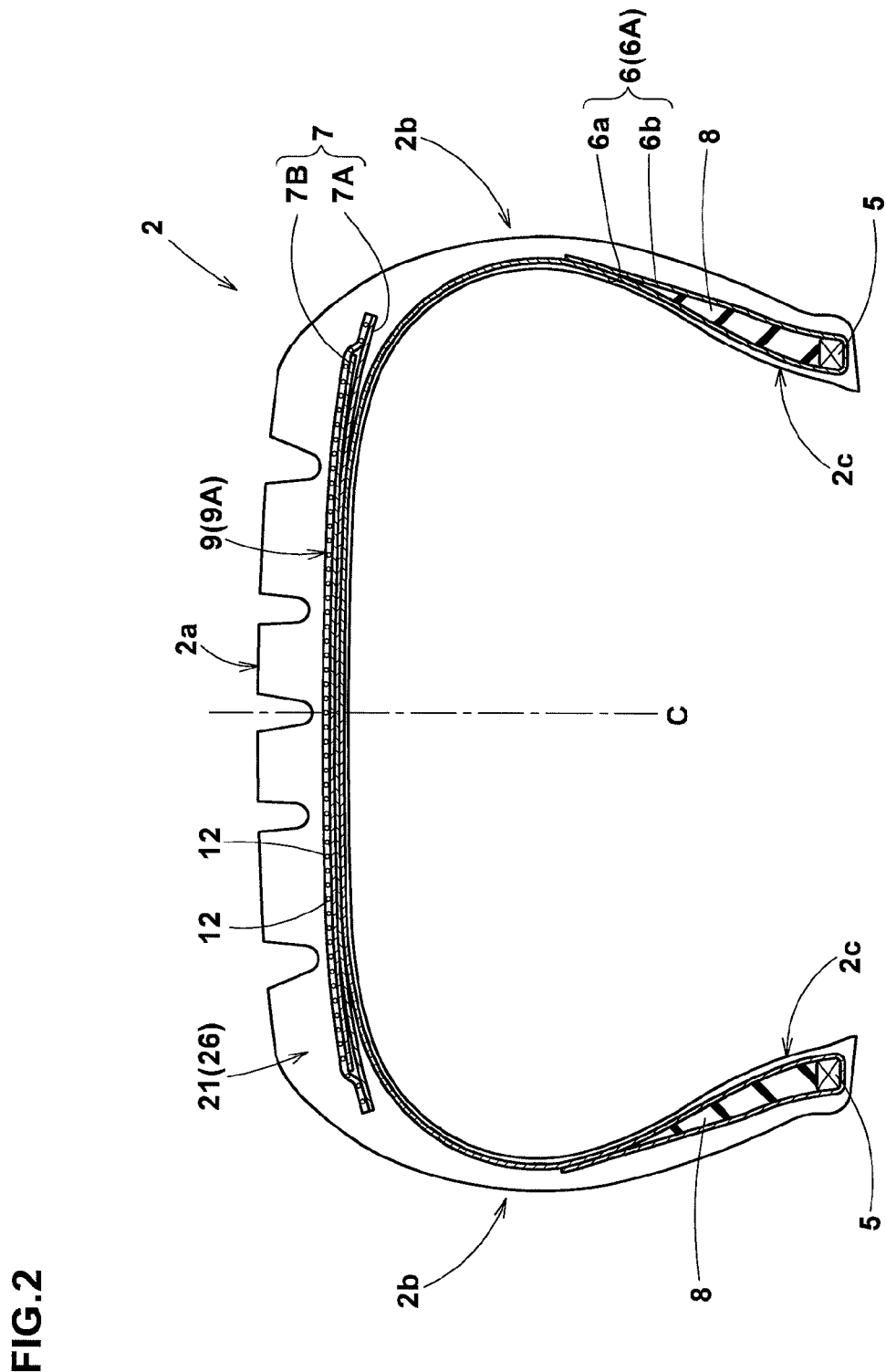
FIG. 2 is a cross sectional view of an example of the pneumatic tire.

As shown in FIG. 2 for example, the pneumatic tire 2 is a passenger car radial tire comprising a tread portion 2$a$, a pair of sidewall portions 2$b$, a pair of bead portions 2$c$ with a bead core 5 therein, a carcass 6 extending between the bead portions through the tread portion and sidewall portions, a belt 7 disposed radially outside the carcass 6 in the tread portion 2$a$ and a band 9 disposed radially outside the belt 7.

The carcass 6 is composed of at least one, in this embodiment only one ply 6A of carcass cords arranged at an angle of from 75 to 90 degrees with respect to the tire equator C and extending between the bead portions 2$c$ through the tread portion 2$a$ and sidewall portions 2$b$, and turned up around the bead core 5 in each bead portions from the axially inside to the outside of the tire to form a pair of turnup portions 6$b$ and a main portion 6$a$ therebetween.

Between the main portion 6$a$ and each turnup portion 6$b$, a bead apex rubber 8 is disposed to extend radially outwardly from the bead core 5.

The belt 7 is composed of at least two cross plies 7A and 7B of parallel cords laid at an angle of from 10 to 35 degrees with respect to the tire circumferential direction.

The band 9 is composed of one ply 9A of at least one cord 12 (e.g. organic fiber cord) and the angle of the cord or cords 12 is almost zero or not more than 5 degrees with respect to the tire circumferential direction.
The ply 9A has a width capable of covering the entire width of the belt 7.
In this embodiment, the ply 9A is formed by spirally winding one or more cords 12 around the outside of the belt 7.

Next, a typical method for manufacturing the pneumatic tire 2 in this embodiment will be described.

Firstly, a raw tire T is built. (raw tire building step)

Figure 3A:
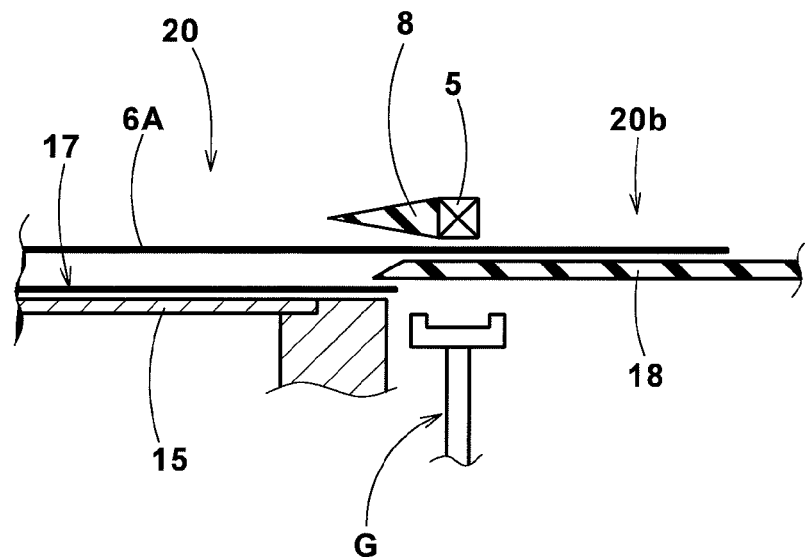
FIGS. 3(a) and 3(b) are schematic partial cross sectional views for explaining steps of building the raw tire.
Figure 3B:
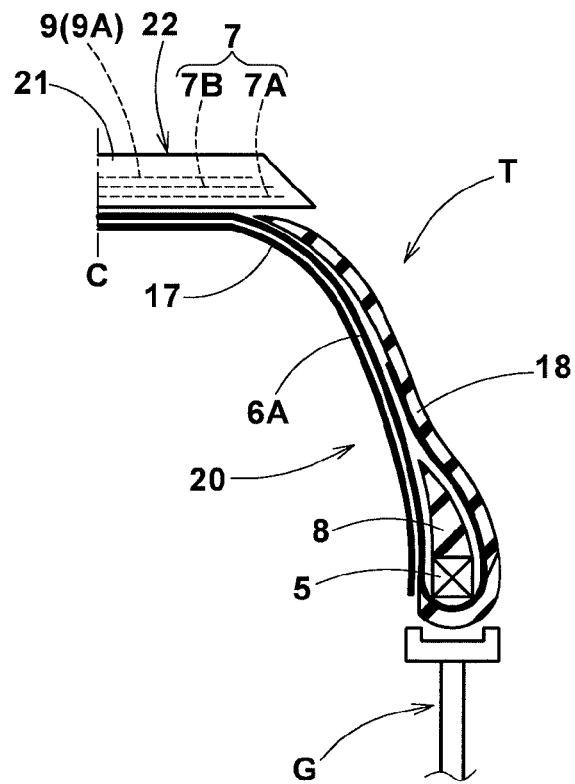

In this raw tire building step, as shown in FIG. 3($a$), unvulcanized inner liner rubber 17 and sidewall rubber 18 and carcass ply 6A are wound sequentially on the outside of the cylindrical tire building drum 15. Then, rubber bead apexes 8 and bead cores 5 are disposed on the outside of the carcass ply 6A from the axially outside, and a tubular main body 20 is formed. Then, the axially outside portions 20$b$ of the tubular main body 20 protruding axially outward from the bead cores 5 are turned.

Next, the tubular main body 20 is inflated into a toroidal shape as shown in FIG. 3($b$), while reducing the axial distance between the bead cores 5 by moving bead lock devices G for holding the bead cores 5 closer to each other. Thereby, the outer peripheral surface of the carcass ply 6A is pressed onto the inner peripheral surface of an annular tread ring 22. The annular tread ring 22 is an assembly of the belt 7, the band 9 and a tread rubber 21 prepared in advance. Thus, the raw tire T is built.

Next, as shown in FIG. 4 for example, the raw tire T is put in a cavity 23 of a vulcanization mold 24 and vulcanized. (Vulcanization Step)
The vulcanization mold 24 comprises a pair of bead rings 24$c$ for holding the bead portions 2$c$ of the raw tire T, a pair of sidewall dies 24$a$ having die surfaces 23$a$ for molding the sidewall portions of the raw tire T, and tread dies 24$b$ having a die surface 23$b$ for molding the tread portion of the raw tire T. These parts are combined to form the cavity 23.
In the tire cavity of the raw tire T put in the mold, a bladder 25 is set and inflated with a high temperature and pressure fluid so that the raw tire T is pressed onto the inner surface of the cavity 23 and vulcanized.
Thus, the tire 2 as shown in FIG. 2 is manufactured.

Figure 5:
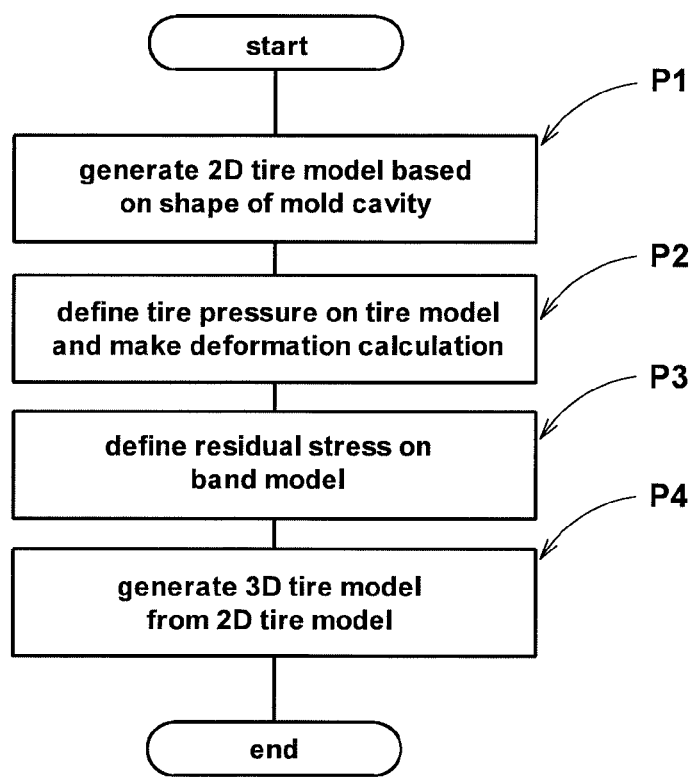
FIG. 5 is a flow chart of the method as an embodiment of the present invention.

FIG. 5 shows a flow chart of a method for generating the tire model 3 of the above-mentioned tire 2.

In this example, according to the cross-sectional shape of the tire molded in the vulcanization mold 24 in the vulcanization step (namely, the shape of the cavity of the vulcanization mold), a two-dimensional contour of the tire model 3 is defined. (step P1)

Figure 6:
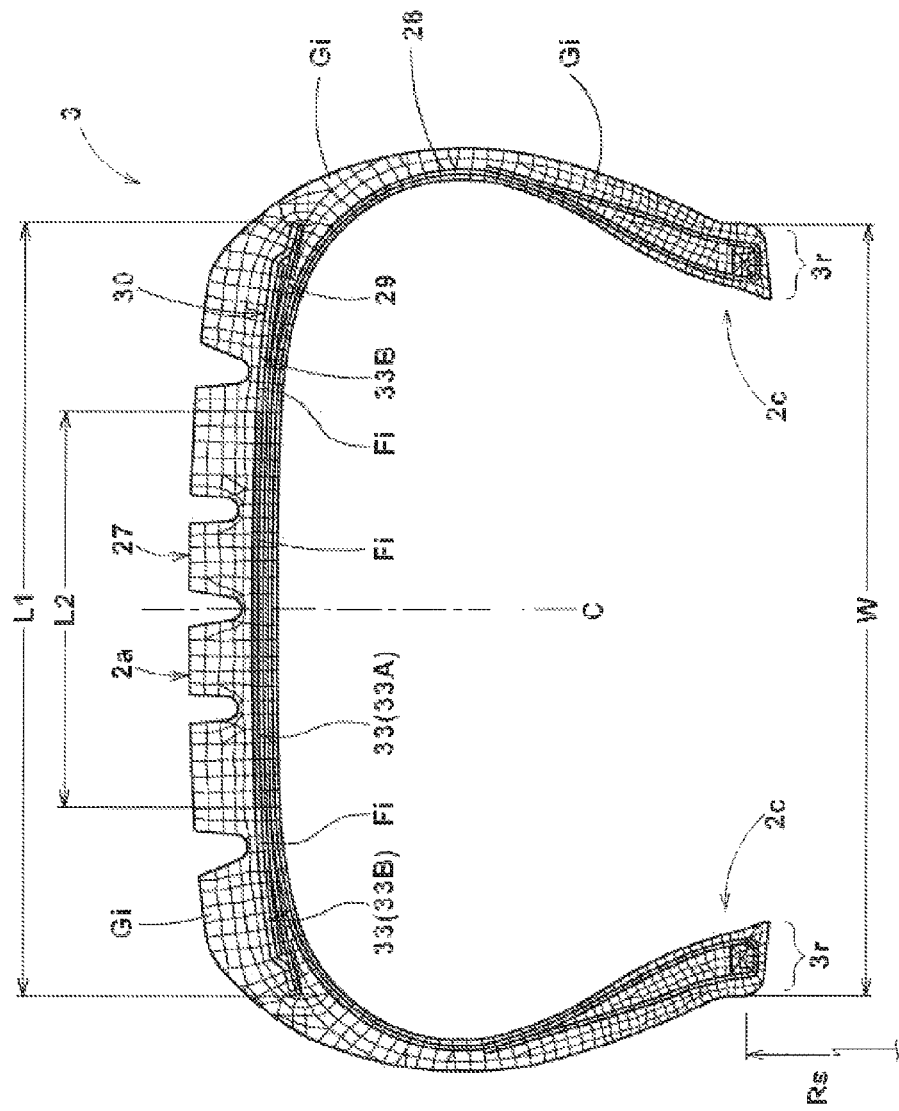
FIG. 6 is a cross sectional view of a two-dimensional tire model.
Figure 7:
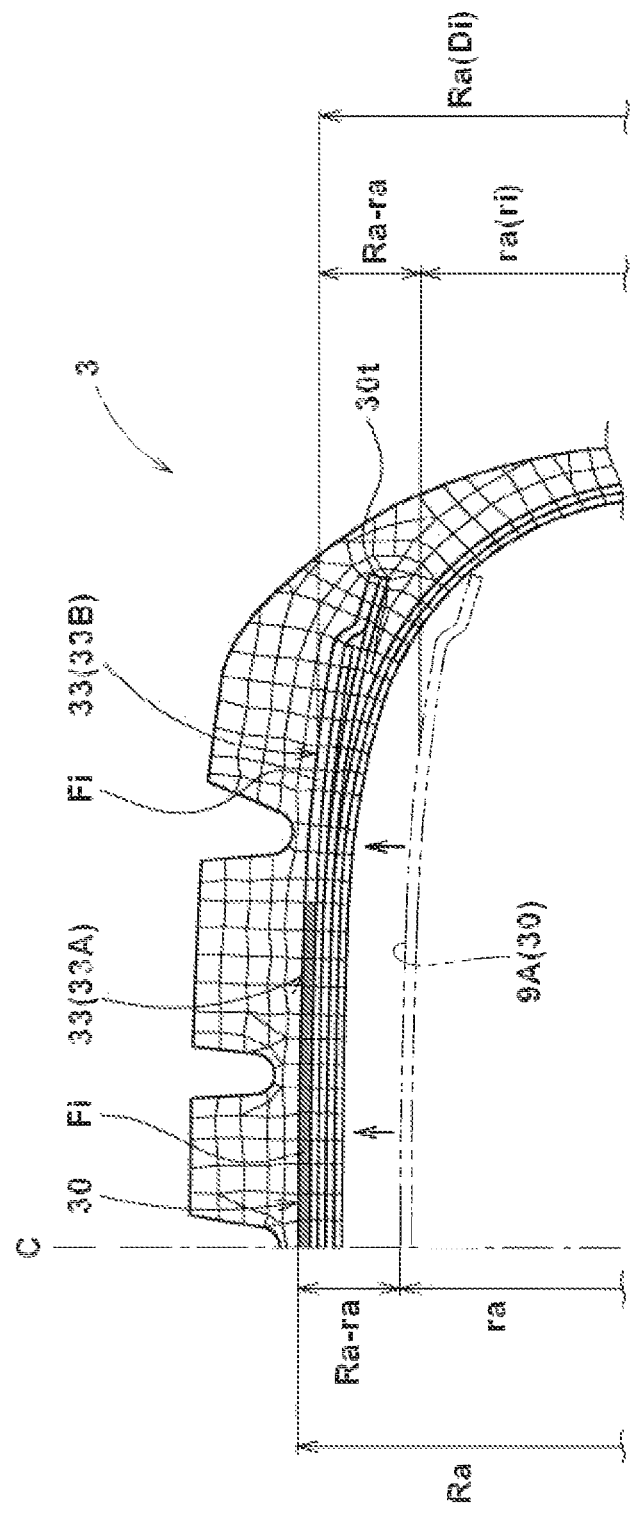
FIG. 7 is a closeup of the tire model shown in FIG. 6.

FIG. 6 shows an example of the tire model 3.

In the tire model 3, the band ply 9A is discretized into two-dimensional elements Fi (i=1, 2 - - -).
Other reinforcing cord members, e.g. the carcass ply 6A and belt plies 7A and 7B and the like and the rubber members 26, e.g. the tread rubber 21 and the like, are discretized into two-dimensional elements Gi (i=1, 2 - - -).
Thus, the tire model 3 in this embodiment is a two-dimensional tire model which includes
a band ply model 30 made up of the elements Fi, and
a carcass ply model 28 and belt ply models 29 and rubber member models 27 each made up of the elements Gi.
Incidentally, generation of such models can be readily made by the use of a mesh-generating software and geometrical data (for example, CAD data) of the vulcanization mold 24.

As to the above-mentioned two-dimensional elements Gi and Fi, quadrilateral elements are preferably used, but elements having other polygonal shapes can be used as well.

For each of the elements Gi and Fi, numerical data—for example, an element number, node point numbers, coordinates of the node points, and material characteristics (for example density, Young's modulus and/or damping coefficient and the like)—are defined and stored in the computer 1.

In the band ply model 30 in this embodiment, the elements Fi are grouped as follows:
a central group 33A consisting of axially abutting elements Fi positioned in a central region of the tread portion 2a, and two lateral groups 33B each consisting of axially abutting elements Fi positioned in tread shoulder regions of the tread portion 2a.

Next, the tire pressure is applied to the tire model 3, and a deformation calculation of the tire model 3 is carried out. (Step P2)

In order to apply the tire pressure, the following conditions are defined:
the rim contacting parts 3r of the tire model 3 are not deformable;
the width w between the bead portions 2c of the tire model 3 is equal to the width of the wheel rim (if necessary, the bead portions 2c are so displaced);
the radial distance Rs of the rim contacting parts 3r from the rotation axis of the tire model 3 is equal to the radius of the wheel rim; and
a uniformly-distributed load corresponding to the tire pressure is applied to the inner surface of the tire cavity of the tire model 3.

under such conditions, the computer 1 make an equilibrium calculation of the tire model 3 to obtain displacements of the node points of the elements of the tire model 3. Thereby, the tire model 3 after the dilation deformation where the rubber member models 27, carcass ply model 28, belt ply models 29 and band ply model 30 are expanded is obtained.

In the meantime, in the case of the actual tire 2, the belt cords and band cords 12 are subjected to large tension during manufacturing the tire, especially during vulcanizing the tire, and residual stress remains in the finished tire. There is a tendency that the shape of the tire 2 during use becomes smaller than the cross-sectional shape in the vulcanization mold 24, and the shape of the tire model 3 based on the cross-sectional shape in the vulcanization mold 24 differs from the shape of the tire 2 during use. Thus, it is difficult to fully improve the simulation accuracy.

As explained above, the inclination angle with respect to the tire circumferential direction is smaller in the band cord than the belt cords. As a result, the residual stress of the band ply 9A tends to become larger than the residual stress of the belt plies 7A and 7B.

Therefore, the method according to the present invention includes a residual stress defining step P3, in which on each element Fi of the band ply model 30, a residual stress Si (i=1, 2 - - - ) caused in the vulcanization step is defined, and then a deformation calculation is carried out.

In this embodiment, on each of the elements Fi belonging to the central group 33A, a residual stress Si obtained by the following computational expression is defined:

$$Si = E \times \{(Ra-ra)/ra\} \times \alpha \tag{1}$$

wherein
E: the Young's modulus of the band cord,
Ra: the mean value of outside diameters Di of all of the elements Fi belonging to the central group 33A,
ra: the mean value of outside diameters ri of all of the elements Fi belonging to the central group 33A before vulcanization,
α: a coefficient.

Further, on each of the elements Fi belonging to the lateral group 33B, a residual stress Si obtained by the following computational expression is defined:

$$Si = E \times \{(Ra-ra)/ra\} \times \alpha \tag{1}$$

wherein
E: the Young's modulus of the band cord,
Ra: the mean value of outside diameters Di of all of the elements Fi belonging to the lateral group 33B,
ra: the mean value of outside diameters ri of all of the elements Fi belonging to the lateral group 33B before vulcanization,
α: a coefficient.

By calculating the computational expression (1), the residual stress Si can be obtained on the assumption that the stress of the band ply 9A before vulcanization is zero. In either group, the outside diameters ri before vulcanization are defined on the elements Fi, respectively, based on those in the band ply 9A before vulcanization.

The term (Ra−ra)/ra represents the expansion rate of the band ply model 30 before and after vulcanization in each group 33A,33B.

There is a tendency that the residual stress in the band ply 9A is reduced by a creep deformation of the band cord 12 during vulcanization. Therefore, the coefficient α is used to adjust the residual stress Si.

The value of the coefficient α is predetermined according to the material of the band cord 12. For example, if the material is nylon, a value between 0.5 and 1.0 is preferred. If the material is aramid, a value between 0.75 and 1.0 is preferred.

There is a tendency that the temperature of the tread dies 24b during vulcanization becomes lower in the tread shoulder portions than in the tread crown portion. Accordingly, hot stretching of the band cord 12 during vulcanization becomes less in the tread shoulder portions in comparison with the tread crown portion. As a result, there is a tendency that the residual stress Si becomes larger in axially outer parts of the band ply 9A than in the central part.

Therefore, it is preferable that, in order to incorporate such variation of the residual stress Si, a value in a range of from about 0.05 to about 0.10 is added to the above-mentioned value of the coefficient α in the case of the two lateral groups 33B. and such modified coefficient α is used in the above-mentioned computational expression (1).

By multiplying each expansion rate (Ra−ra)/ra by the Young's modulus E of the band cord 12 and the coefficient α as in the expression (1), the residual stress Si of each element Fi of the band ply model 30 can be obtained.

By the residual stress Si, the tire model 3 is deformed so that the contour becomes smaller similarly to the actual tire 2. Accordingly, the tire model 3 can simulate the tire 2 during use more accurately to improve the simulation accuracy.

In this embodiment, residual stress is not defined on the belt ply model 29, therefore, an increase in the computational cost can be avoided.

In this embodiment, further, since the residual stress Si is computed collectively for the central group 33A and also for the two lateral groups 33B, the computational time can be greatly reduced in comparison with a method in which the residual stress Si is computed for each element Fi.

In this embodiment, when the outside diameters Di of the elements Fi is gradually decreased from the tire equator side to the tread edge side and the outside diameters ri of the elements Fi before vulcanization have a constant value, it is possible to set the residual stress Si for the elements Fi belonging to the central group 33A more than the residual stress Si for the elements Fi belonging to the two lateral groups 33B in order to approximate the residual stress Si to the actual residual stress of the band ply 9A of the tire 2.

The axial width L2 of the central group 33A is preferably set in a range of from 30 to 60% of the axial width L1 of the band ply model 30 as shown in FIG. 6.

If the width L2 exceeds 60% of the width L1, there is a possibility that the contour of the tire model 3 becomes excessively shrunk in the tread crown portion. If the width L2 is less than 30% of the width L1, there is a possibility that the contour of the tire model 3 becomes excessively expanded in the tread crown portion.

In this embodiment, before implementing the residual stress defining step P3, the above-mentioned step P2 in which the tire pressure is applied and a deformation calculation is carried out, is implemented. Therefore, it is prevented that the size of the tire model 3 deformed by the residual stress Si becomes smaller than the size of the tire model 3 before the dilation deformation. As a result, it is possible to avoid a compression calculation of a topping rubber model (not shown) of the topping rubber of the band ply included in the band ply model 30. Thereby, the stability of the computation can be improved.

Next, a step P4 of generating a three-dimensional model 31 is implemented.

Figure 8:
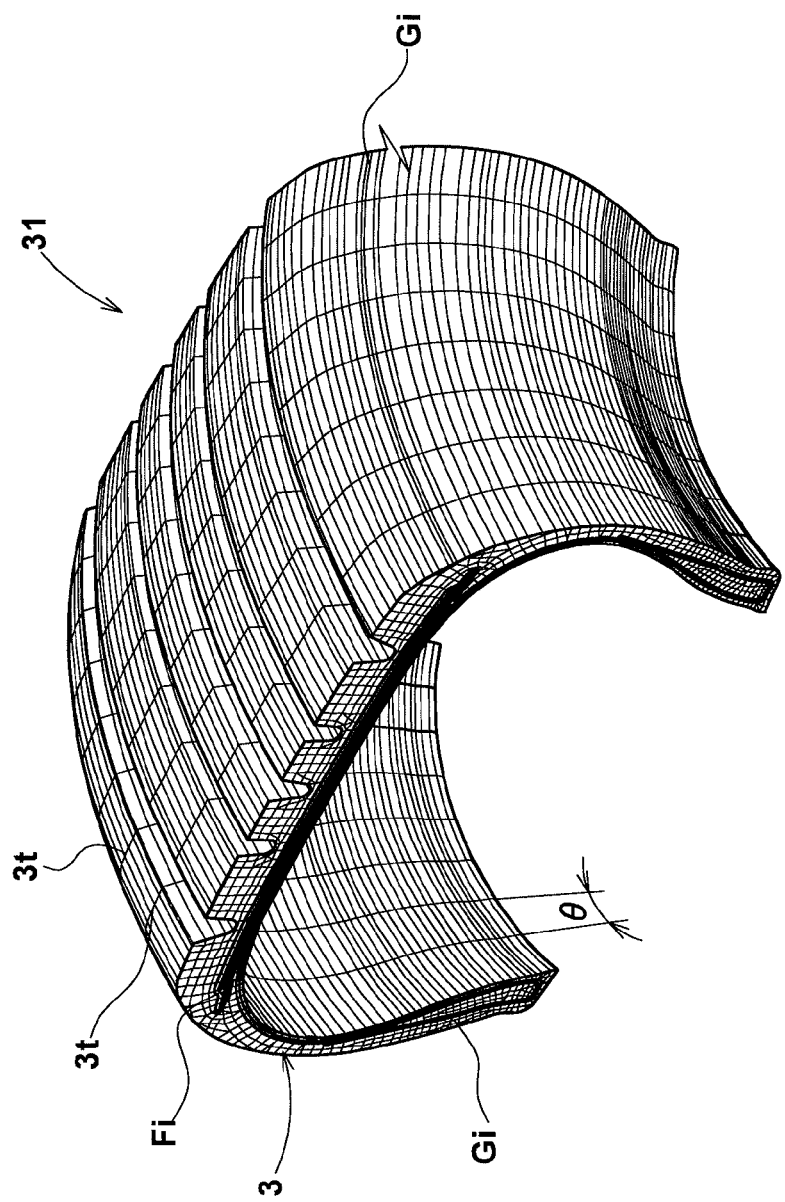
FIG. 8 is a perspective partial view of a three-dimensional tire model generated from the two-dimensional tire model shown in FIG. 6.

In this step P4, as shown in FIG. 8, the node points 3t of the two-dimensional tire model 3 generated as above are circumferentially duplicate around the tire rotational axis at intervals of a small angle θ, and the node points 3t are mutually linked. Thereby, a three-dimensional model 31 of the tire inflated to the tire pressure can be generated readily in a short time.

Figure 9A:
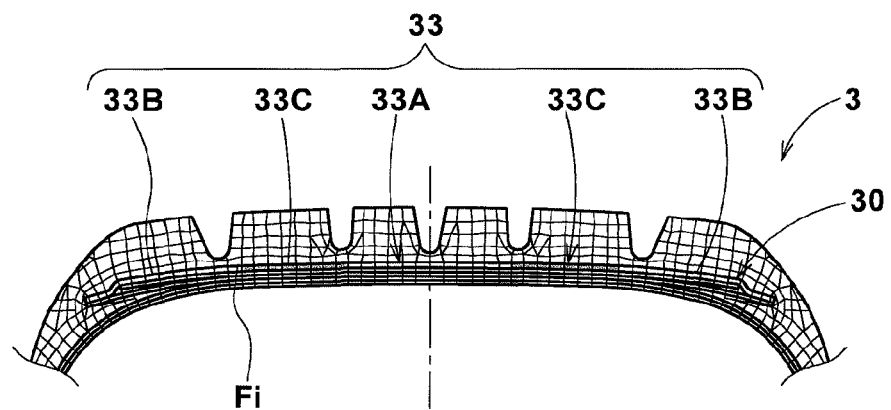
FIG. 9($a$) is a cross sectional view of the band ply model of which elements are grouped into five groups.

In the above described embodiment, the elements of the band ply model 30 are grouped into three groups 33A, 33B and 33B. But, it is also possible to group into four or more groups 33, for example, five groups 33A, 33B, 33B, 33C and 33C as shown in FIG. 9(a), and the residual stress Si is computed collectively for each group 33 in order to approximate the residual stress Si to the actual residual stress of the band ply 9A.

Figure 9B:
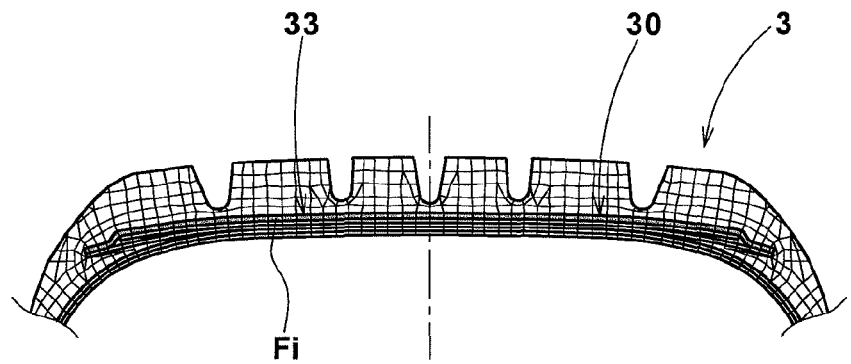

Further, it is also possible to group the elements Fi of the band ply model 30 into only one group 33 as shown in FIG. 9(b), and the residual stress is computed collectively for the one group 33, namely, all of the elements Fi have uniform residual stress. In this case, the computational time can be greatly reduced.

Figure 10:
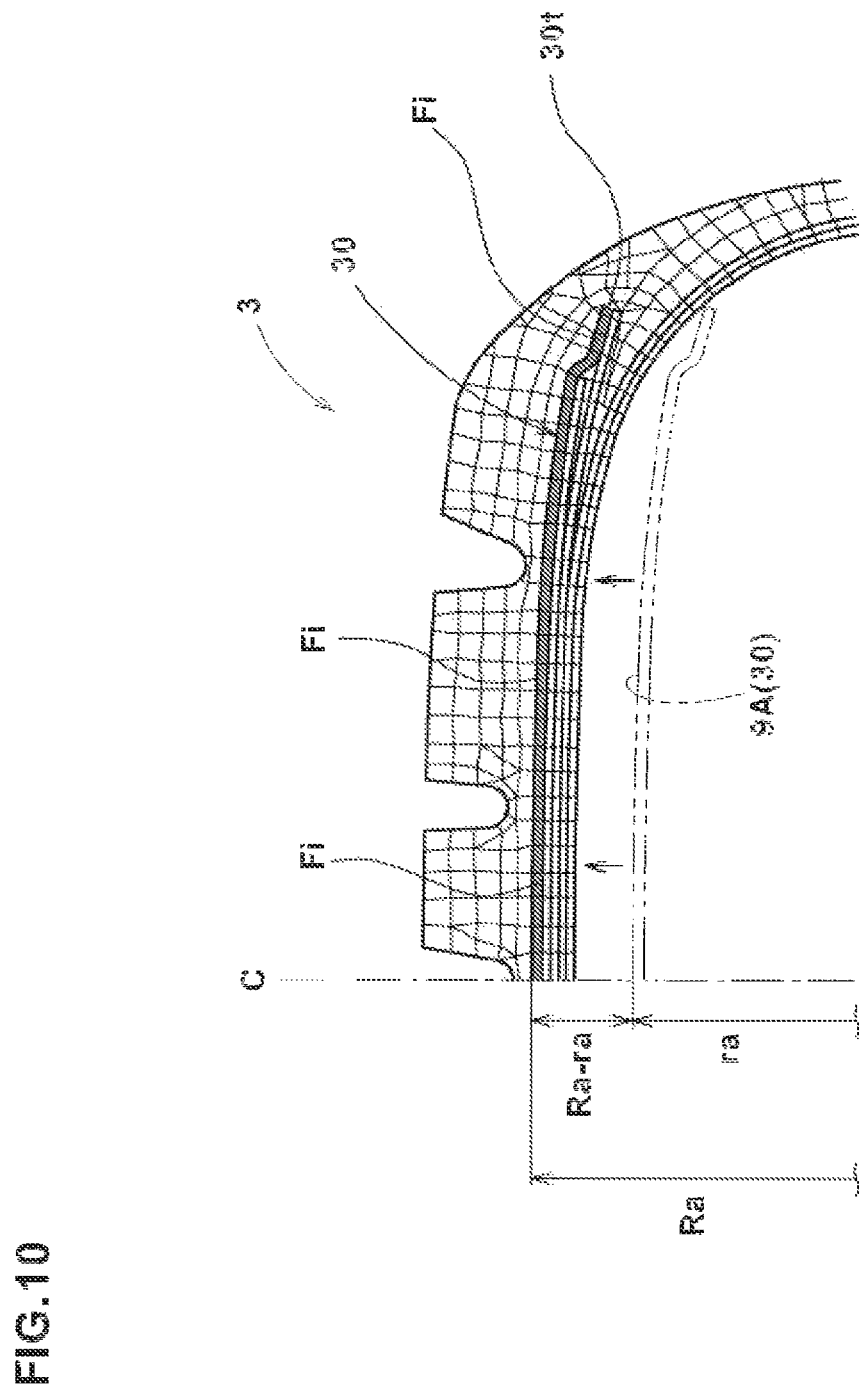
FIG. 10 is a cross sectional view of the band ply model of which elements are not grouped.

Furthermore, it is also possible that the elements Fi of the band ply model 30 are not grouped as shown in FIG. 10, and the residual stress Si is computed for each of the elements Fi. In this case, the above-mentioned "Ra" and "ra" in the computational expression (1) are as follows:
Ra is the outside diameter of each element Fi,
ra is the outside diameter of the element Fi before vulcanization.
(Ra−ra)/ra is the expansion rate of the element Fi before and after vulcanization.

Figure 11:
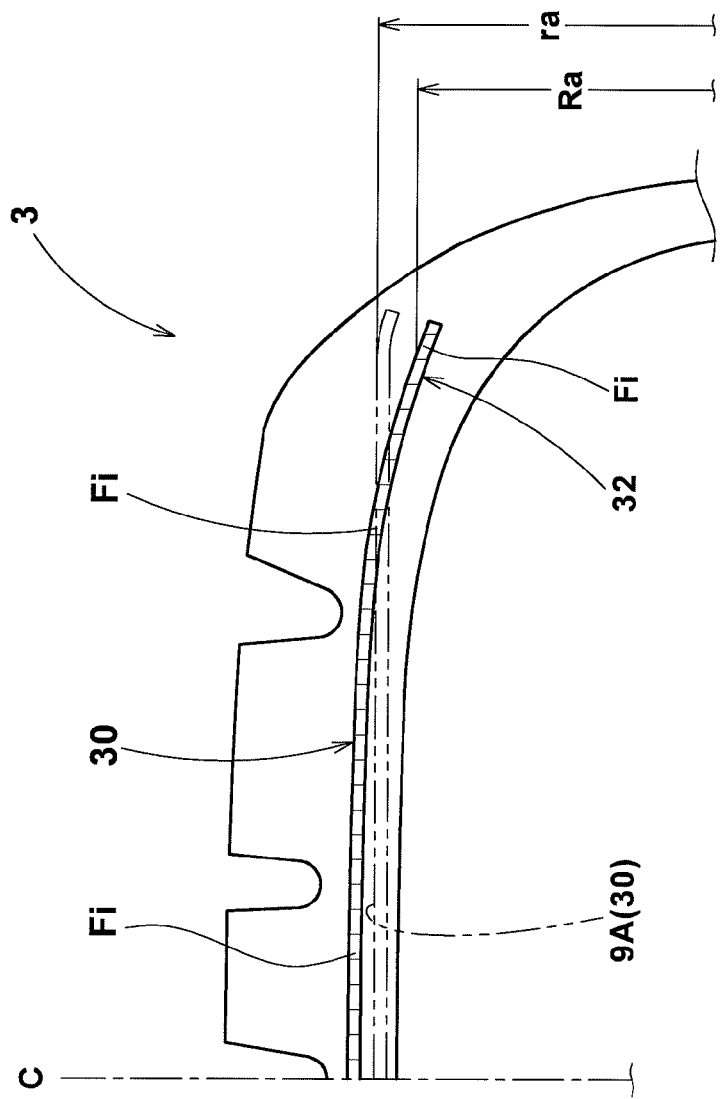
FIG. 11 is a cross sectional view of another example of the tire model.

As shown in FIG. 11, if a shrunk region 32 where the outside diameter Ra becomes less than the outside diameter ra exists in the tire 2, a tension (residual stress) does not occur in the band cord 12 existing in the shrunk region 32.

In this case, it is desirable that, in order to make the shape of the tire model 3 approximate to the shape of the tire 2 during use, the residual stress Si of zero value is defined on the elements Fi belonging to the shrunk region 32. More specifically, in the calculation of the residual stress Si using the expression (1), zero is set to the coefficient α for the elements Fi belonging to the shrunk region 32.

Comparison Test

Twenty one pneumatic tires different from each other in tire size and/or internal structure were prepared, and under the normally inflated and loaded states of the respective tires, their footprints were recorded.

The tire models 3 of the above-mentioned tires were generated according to the flow chart shown in FIG. 5, and their footprints under the normally inflated and loaded states of the respective tires were computed, wherein the residual stress Si was computed collectively for each of the central group 33A and lateral groups 33B.

For comparison, according to the flow chart shown in FIG. 5 from which the residual stress defining step was omitted, the tire models of the above-mentioned tires were generated, and their footprints under the normally inflated and loaded states of the respective tires were computed.

Then, a center rib and shoulder rib appearing in each of the footprints were measured for their circumferential lengths under the same conditions.

With respect to the measured circumferential lengths, the coefficient of correlation between the tire models 3 and the actual pneumatic tires, and the coefficient of correlation between the comparative tire models and the actual pneumatic tires were calculated. In the result, the former became 0.93, whereas the latter was 0.57. Thus, it was confirmed that a tire model according to the present invention has a high correlativity to the actual tire.

Further, it was also confirmed by visual comparison that the footprints of the tire models 3 were approximate to those of the actual pneumatic tires than the comparative tire models.

In the method according to the present invention, therefore, the simulation accuracy can be improved.

The invention claimed is:

1. A computerized method for generating a finite element model of a pneumatic tire manufactured through
   a step of building a raw tire provided in a tread portion with a band ply composed of a band cord having a cord angle of not more than 5 degrees with respect to the tire circumferential direction, and
   a step of vulcanizing the raw tire in a vulcanization mold, the method comprising
   a step in which, based on a cross-sectional shape of the tire in the vulcanization mold, a tire model which is a two-dimensional finite element model of the tire is generated, wherein the tire model includes a band ply model of the band ply made up of two-dimensional elements,
   a step in which a deformation calculation is made on the two-dimensional tire model on which a condition of a tire pressure is defined,
   a residual stress defining step in which a residual stress Si caused by the vulcanizing step is computed by the following manner (III) and defined on each of the two-dimensional elements of the band ply model of the two-dimensional tire model,
   a step in which a deformation calculation is made on the two-dimensional tire model to obtain the deformed two-dimensional tire model, and
   a step in which node points of the deformed two-dimensional tire model are circumferentially duplicated around the tire rotational axis at intervals of a small angle, and the node points are mutually linked to generate a three-dimensional tire model, (III) the elements of the band ply model are grouped into a plurality of groups each consisting of axially abutting elements, and, for each of the groups, the residual stress Si is computed collectively by the following expression $$Si = E \times \{(Ra - ra)/ra\} \times \alpha$$

wherein

E: the Young's modulus of the band cord,

Ra: the mean value of the outside diameters of the elements belonging to the group, ra: the mean value of the outside diameters of the elements belonging to the group before vulcanization, α: a coefficient, wherein said groups include a central group consisting of the elements existing in a central region of the tread portion, and two lateral groups consisting of the elements existing in shoulder regions of the tread portion, and wherein the residual stress Si for the band ply elements belonging to the central group is more than the residual stress Si for the band ply elements belonging to the two lateral groups.

2. A computerized method for generating a finite element model of a pneumatic tire manufactured through a step of building a raw tire provided in a tread portion with a band ply composed of a band cord having a cord angle of not more than 5 degrees with respect to the tire circumferential direction, and a step of vulcanizing the raw tire in a vulcanization mold, the method comprising:

a step in which, based on a cross-sectional shape of the tire in the vulcanization mold, a tire model which is a two-dimensional finite element model of the tire is generated, wherein the tire model includes a band ply model of the band ply made up of two-dimensional elements, a step in which a deformation calculation is made on the two-dimensional tire model on which a condition of a tire pressure is defined, a residual stress defining step in which a residual stress Si caused by the vulcanizing step is computed by the following manner (III) and is defined on each of the two-dimensional elements of the band ply model of the two-dimensional tire model, a step in which a deformation calculation is made on the two-dimensional tire model to obtain the deformed two-dimensional tire model, and a step in which node points of the deformed two-dimensional tire model are circumferentially duplicated around the tire rotational axis at intervals of a small angle, and the node points are mutually linked to generate a three-dimensional tire model, (III) the elements of the band ply model are grouped into a plurality of groups each consisting of axially abutting elements, and, for each of the groups, the residual stress Si is computed collectively by the following expression $$Si = E \times \{(Ra - ra)/ra\} \times \alpha$$

wherein

E: the Young's modulus of the band cord,

Ra: the mean value of the outside diameters of the elements belonging to the group, ra: the mean value of the outside diameters of the elements belonging to the group before vulcanization, α: a coefficient, wherein said groups include a central group consisting of the elements existing in a central region of the tread portion, and two lateral groups consisting of the elements existing in shoulder regions of the tread portion, wherein the residual stress Si for the band ply elements belonging to the central group is more than the residual stress Si for the band ply elements belonging to the two lateral groups, and, wherein the axial width of the central group is in a range of from 30% to 60% of the axial width of the band ply model.

* * * * *